United States Patent [19]

Moon

[11] 4,195,305
[45] Mar. 25, 1980

[54] LATTICE CONSTANT GRADING IN THE ALLOY SYSTEM

[75] Inventor: Ronald L. Moon, Palo Alto, Calif.

[73] Assignee: Varian Associates, Inc., Palo Alto, Calif.

[21] Appl. No.: 945,653

[22] Filed: Sep. 25, 1978

[51] Int. Cl.$^2$ ............................................. H01L 29/16
[52] U.S. Cl. ......................................... 357/16; 357/30; 357/61; 357/88
[58] Field of Search .................. 357/16, 17, 61, 88, 357/30

[56] References Cited

U.S. PATENT DOCUMENTS 4,032,951  6/1977  DeWinter et al. ...................... 357/17

FOREIGN PATENT DOCUMENTS 49-71885  7/1974  Japan .

OTHER PUBLICATIONS

Saul, R., *Journ. Electrochem. Soc.*, May 1971, vol. 118, No. 5, pp. 793–795.

*Primary Examiner*—Martin H. Edlow
*Attorney, Agent, or Firm*—Stanley Z. Cole; Edward H. Berkowitz

[57] ABSTRACT

Liquid phase epitaxy is employed to grow a lattice matched layer of GaAsSb on GaAs substrates through the compositional intermediary of the III–V alloy system AlGaAsSb which acts as a grading layer. The Al constituent reaches a peak atomic concentration of about 6% within the first 2.5 μm of the transition layer, then decreases smoothly to about 1% to obtain a lattice constant of 5.74 A. In the same interval the equilibrium concentration of Sb smoothly increases from 0 to about 9 atomic percent to form a surface on which a GaAsSb layer having the desired energy bandgap of 1.1 ev for one junction of an optimized dual junction photovoltaic device. The liquid phase epitaxy is accomplished with a step cooling procedure whereby dislocation defects are more uniformly distributed over the surface of growing layer.

6 Claims, 3 Drawing Figures

LATTICE CONSTANT GRADING IN THE $Al_yGa_{1-y}As_{1-x}Sb_x$ ALLOY SYSTEM

The Government of the United States of America has rights in this invention pursuant to Department of Energy Contract No. EY-76-C-03-1250.

BACKGROUND OF THE INVENTION

This invention pertains to the preparation of semiconductor materials and in particular to obtaining a lattice constant grading layer from a GaAs substrate to $GaAs_{1-x}Sb_x$.

The efficiency of a combination of photovoltaic cells is known to be a function of the choice of bandgaps for the respective cells. For a dual, stacked configuration an optimum choice of 1.1 ev and 1.65 ev has been shown for a standard solar spectrum. Implementation of such a multigap photovoltaic device is particularly attractive in the quaternary alloy system, AlGaAsSb for which a range of direct bandgap between 0.7 and 1.9 ev is readily achievable.

The fabrication of a multi-junction stacked device on a GaAs substrate introduces problems of lattice mismatch. The resulting defect density introduces losses which degrade the achievable efficiency for such devices. It is well known in the prior art to match unequal lattice constants of differing materials by growing an intermediate transition layer characterized by a gradually varying lattice constant. As employed herein, the term "lattice matched" is meant to convey that the lattice constants of the respective adjacent layers are matched to within 0.5%. $Al_yGa_{1-y}As_{1-x}Sb_x$ will be understood by the symbols AlGaAsSb for the purposes of this work.

Prior art lattice matching of GaAsSb on GaAs has been accomplished through step grading by growth of successive layers, each layer higher in Sb concentration than the underlying layer. Clearly this approach requires a considerable manufacturing effort.

Another prior art approach employs continuous grading by addition of a phosphorous (P) constituent. The gradual depletion of P leads to the desired lattice constant. Considerable accuracy in P concentration (of the order of 1 part in $10^5$) is required for initial lattice matched growth because of the small amounts of P involved.

An even greater disadvantage with this approach is inherent in the difficulty in maintaining reproducibility in manufacture owing to the effect on the GaAsSbP soluion from the high vapor pressure of P.

Still another prior art technique utilizes the growth of lattice matched layers of GaAsSb through substitution of Al for Ga while maintaining constant the concentration ratio As/Sb. This constant ratio maintenance in addition to the controlled variation of the Al/Ga ratio requires much process control equipment and supervision.

It is known, in the liquid phase epitaxy of a number of III-V binaries, that intermittent cooling reduces the dislocation density for the growth.

SUMMARY OF THE INVENTION

The principal object of the present invention is the provision of an epitaxial layer of AlGaAsSb lattice constant graded from a GaAs substrate and devices using the same.

In one feature of the invention the Al constituent of an epitaxial layer of AlGaAsSb is varied first in increasing, and then decreasing proportion with the thickness of said layer for obtaining a lattice grading between a GaAs substrate and a desired GaAsSb layer whereby reproducible control is obtained over lattice constant and bandgap energy of the epitaxial layer.

In another feature of the invention the bandgap energy of 1.1 ev characteristic of $Ga_mAs_{0.8}Sb_{0.2}$ is accomplished to obtain a band gap energy suitable for one junction of a two junction photovoltaic device.

In yet another feature of the invention crystal defects tending to concentrate locally are dispersed over planes within the grown layer, such planes being approximately parallel to the substrate surface.

These and other objects are obtained by employing the quaternary system AlGaAsSb to accomplish lattice constant grading by liquid phase epitaxy on GaAs.

Other features and advantages of the present invention will become apparent upon a perusal of the following specification taken in connection with the accompanying drawings wherein:

DESCRIPTION OF THE PREFERRED EMBODIMENT

Figure 1:
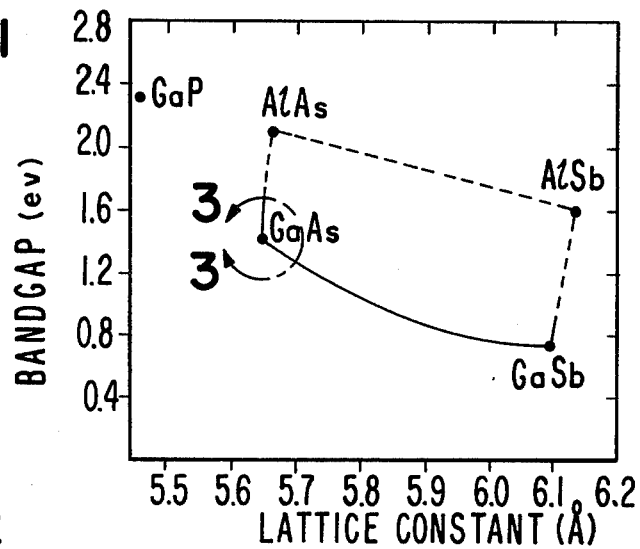
FIG. 1 is a lattice constant-band gap energy diagram for the AlGaAsSb alloy system.

Referring now to FIG. 1 there is shown the bandgap energy versus lattice constant phase diagram for the quaternary III-V alloy system of AlGaAsSb. This quaternary III-V alloy provides bandgap energies between 0.7 and 2.1 electron volts with the corresponding lattice constants falling within the range of 5.65 to 6.1 A. The curves which form the boundaries of this region are characteristic of the ternary alloys, GaAsSb, GaAlSb, AlAsSb and AlGaAs. The intersection points between these bounds represent the respective binary alloys.

In accord with the invention, an epitaxial layer is grown upon a substrate of gallium arsenide by any one of a number of different suitable methods. One such method employs a sliding graphite boat in a hydrogen atmosphere, after the method of M. B. Panish et al. as further described in "Preparation of Multi-layer LPE Heterostructures with Crystalline Solid Solutions of $Al_xGa_{1-x}As$ Heterostructure Lasers" appearing in the metallurgical transactions of the AIME, line 2, pages 795–801 (March 1971). In the present invention epitaxial layers of the quaternary system AlGaAsSb are grown by liquid phase epitaxy on a substrate or substrate layer of (111) A or B oriented single crystal GaAs substrates at 830° C. as further described below.

Preparation of the GaAs substrate is accomplished by any suitable standard chemical-mechanical technique. According to the preferred method the GaAs substrate or substrate layer is lapped with silicon carbide grit and chemipolished on NaOCl then rinsed in $H_2O$. Subsequent solvent baths and chemical etches may be employed when the prepared substrate has been stored prior to commencement of the liquid phase epitaxy described herein. In the present invention, liquid phase epitaxy has been carried out in a standard graphite boat apparatus as described above.

The growth solution is prepared by establishing a weight ratio, R, of Sb/Ga in the range $0 < R \leq 4$. This is separately baked to remove volatile impurities. The solution is then saturated with GaAs to which there is added an Al admixture, the latter present in a range of from $1 \times 10^{-3}$ to $5 \times 10^{-3}$ atomic percent.

Growth his been accomplished over the temperature range from 830° C. to 770° C. and a somewhat wider temperature range is anticipated for practice of the invention. Cooling rates are maintained at less than 0.5° C./min. Typically, the cooling rate is maintained at 0.25° C./min.

It is especially desirable to employ a temperature range extending to lower temperatures (for example 730° C. to 650° C.) for growth of (100) oriented crystals. The growth rate for (100) layers is substantially lowered at the lower temperature and a smoother surface results.

Figure 2:
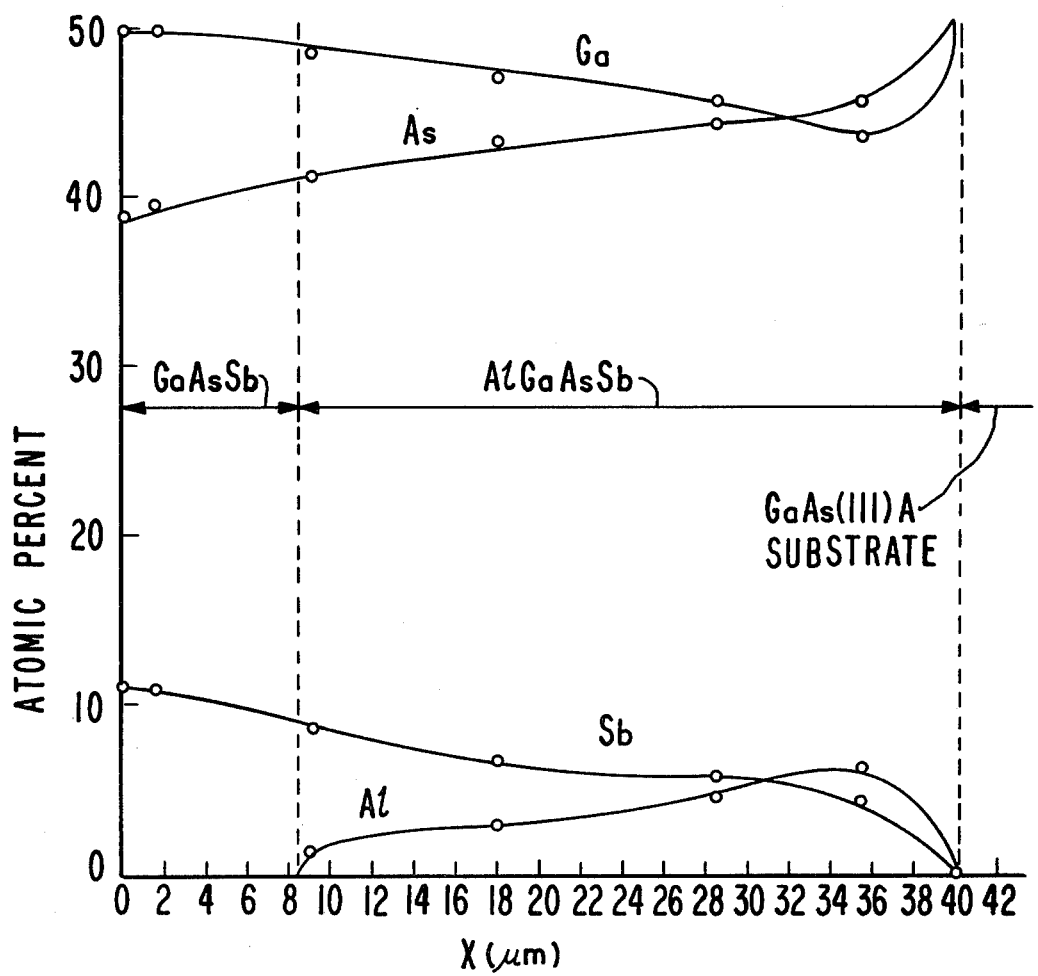
FIG. 2 is a depth concentration analysis of the constituents of the material of the present invention.

As a result of the liquid phase epitaxy above-described, lattice grading from GaAs to GaAsSb has been oriented. FIG. 2 shows the composition as a function of thickness in a typical sample of the product so obtained. These data were obtained in standard fashion using an electron microprobe. Spatial resolution of approximately 1 to $1.5\mu$ characterizes each point. Thicknesses of transition layers have been obtained in the range from 20 to 30 $\mu$m starting from GaAs(111)A and about 10 to 15 $\mu$m has been obtained from the (111)B orientation.

One advantage of the present method is to be found in the latitude for proportions of the melt composition. FIG. 1 demonstrates that the lattice constant is practically insensitive to concentration of the Al admixture. In the present invention, an upper limit is placed upon the Al admixture to prevent premature exhaustion of the As concentration, thus halting the desired growth. The result of increasing the Al concentration within the preferred range is to increase the thickness required for the compositionally graded material to deplete the Al component to a negligible proportion.

Figure 3:
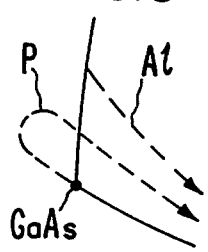
FIG. 3 is a detail of FIG. 1 comparing Al and P effects.

Turning now to FIG. 3, the phase diagram is considered in greater detail for comparing the paths describing the phase states for the present invention and for a prior art approach using P depletion. It will be observed that the initial effect of the P admixture is to pull the phase state toward the position of GaP indicated in FIG. 1, initially decreasing the lattice constant. If the initial P concentration is not within the desired limits a lattice constant actually less than that of GaAs will result. According to the present invention, the desired lattice constant is approached monotonically.

Improved surface morphology has been found when the cooling is carried out in steps over intervals of 5 to 10° C. After the temperature has fallen through the selected interval, the temperature is maintained at the lower level for a period of approximately 5-10 minutes. The cooling is then resumed for the next step. As a result of step cooling, it has been found that the residual concentration of dislocations at each step is uniformly distributed over the surface of the growing layer at that time. The exact mechanism for this effect is not well understood. It is known that dislocations tend to congregate locally; consequently, with continuous cooling dislocations tend to be distributed more or less uniformly in the direction of growth while maintaining a quite nonuniform distribution in a plane orthogonal to the growth direction. It is conjectured that migration of dislocations is enhanced by an as yet unidentified mechanism operative at the solvent-liquid interface.

Step cooling has been found to be practical with the quarternary system of the present invention and no disturbance has been detected for the desired properties of the grown layer.

While the invention has been described as a general subassembly without reference to a specific application, it will be obvious to those skilled in the art that the invention may be utilized in the manufacture of a number of devices. For example, multigap photovoltaic cells, heterojunction lasers and light emitting diodes can employ the subject invention.

The above description contains specifications which should not be construed as limitations upon the scope of the invention since many variations are possible. Therefore, the true scope of this invention should be determined only by the appended claims and their legal equivalents.

What is claimed is:

1. A semiconductor device subassembly comprising a crystalline GaAs substrate and a transition layer of AlGaAsSb grown on said substrate and compositionally graded in Al content to substantially match the lattice constant of said substrate at said substrate surface, said layer further graded in diminishing Al composition in the direction of growth.

2. The semiconductor subassembly of claim 1 resulting from liquid phase epitaxial growth in a temperature substantially including the range from 830° C. to 770° C. wherein said substrate is oriented in the (111) crystalline orientation.

3. The semiconductor subassembly of claim 2 wherein dislocation defects resulting from said growth are disbursed over a plurality of planes mutually spaced apart and orthogonal to said direction of growth.

4. The semiconductor subassembly of claim 2 wherein the graded concentration of Al attains a maximum magnitude in the range 5 to 7 atomic percent in a region of said layer spaced apart from said substrate surface and said Al concentration thereafter diminishes.

5. The semiconductor subassembly of claim 2 wherein said diminishing Al composition substantially vanishes, whereby an upper surface GaAsSb is achieved.

6. The semiconductor subassembly of claim 1 resulting from liquid phase epitaxial growth in a temperature substantially including the range from 830° C. to 650° C. wherein said substrate is oriented in the (100) crystalline orientation.

* * * * *

UNITED STATES PATENT AND TRADEMARK OFFICE
CERTIFICATE OF CORRECTION

PATENT NO. : 4,195,305

DATED : March 25, 1980

INVENTOR(S) : Ronald L. Moon

It is certified that error appears in the above–identified patent and that said Letters Patent are hereby corrected as shown below:

IN THE TITLE:

After "THE", add --$Al_yGa_{1-y}As_{1-x}Sb_x$

Signed and Sealed this

Twenty-fourth Day of June 1980

[SEAL]

Attest:

SIDNEY A. DIAMOND

Attesting Officer

Commissioner of Patents and Trademarks